United States Patent [19]

Frantz

[11] Patent Number: 5,151,647
[45] Date of Patent: Sep. 29, 1992

[54] ENHANCED CHARGING SYSTEM DIAGNOSTIC METHOD

[75] Inventor: Douglas C. Frantz, Lake Orion, Mich.

[73] Assignee: Chrysler Corporation, Highland Park, Mich.

[21] Appl. No.: 700,748

[22] Filed: May 15, 1991

[51] Int. Cl.$^5$ .......................................... H02K 11/00
[52] U.S. Cl. ...................................... 322/99; 322/11; 324/158 MG
[58] Field of Search ..................... 322/99, 11, 59, 12, 322/10; 320/48; 324/158 MG

[56] References Cited

U.S. PATENT DOCUMENTS

| | | | |
|---|---|---|---|
| 3,999,127 | 11/1974 | Siegl | 322/99 |
| 4,314,193 | 2/1982 | Mortonson | 322/28 |
| 4,451,774 | 5/1984 | Akita et al. | 320/64 |
| 4,583,036 | 8/1985 | Morishita et al. | 320/39 |
| 4,673,862 | 6/1987 | Wahlstrom | 320/64 |

*Primary Examiner*—Steven L. Stephan
*Assistant Examiner*—Ben Davidson
*Attorney, Agent, or Firm*—Mark P. Calcaterra

[57] ABSTRACT

A method for detecting full or partial inoperability of a vehicular alternator battery charging system monitors the vehicle's battery voltage and compares it against a controlled reference voltage. When the monitored voltage differs from the target by an amount which is a function of engine rotational speed for a minimum preselected time period, the alternator is disabled and the voltage drop at the battery is monitored to determined whether the alternator is malfunctioning. By observing the voltage drop when the alternator is disabled, the method can distinguish between a charging system problem and a normal state wherein the load exceeds the alternator's maximum output current capacity.

16 Claims, 1 Drawing Sheet

ENHANCED CHARGING SYSTEM DIAGNOSTIC METHOD

BACKGROUND OF THE INVENTION

The invention relates generally to diagnostic systems for detecting operability of a vehicle's battery charging system. More specifically, the invention concerns a diagnostic method which operates without the need for an alternator current sensing device.

Known systems for detecting alternator output failure in automotive electrical systems utilize expensive and failureprone current sensing devices placed in the alternator output.

There is seen to be a need for a charging system failure detection method sensing battery voltage rather than current and capable of detecting partial as well as full failure modes of alternator operation.

SUMMARY OF THE INVENTION

The invention contemplates a method for detecting full and partial alternator charging output failure in a charging system for a vehicle having a battery and an alternator for charging the battery. The method comprises the steps of monitoring output voltage of the battery; monitoring vehicular engine rotational speed; determining a desired minimum difference between the battery voltage and a target battery voltage level, the difference being a function of the vehicular engine rotational speed; turning off the alternator whenever the monitored battery voltage differs from the target voltage by an amount greater than the desired minimum difference; determining a minimum acceptable battery voltage drop in the absence of alternator charging current as a function of the vehicular engine rotational speed; and indicating a charging system fault whenever the minimum acceptable battery voltage drop is not present in the absence of alternator charging current.

BRIEF DESCRIPTION OF THE DRAWINGS

The objects and features of the invention will become apparent from a reading of a detailed description taken in conjunction with the drawings, in which.

DETAILED DESCRIPTION

Figure 1:
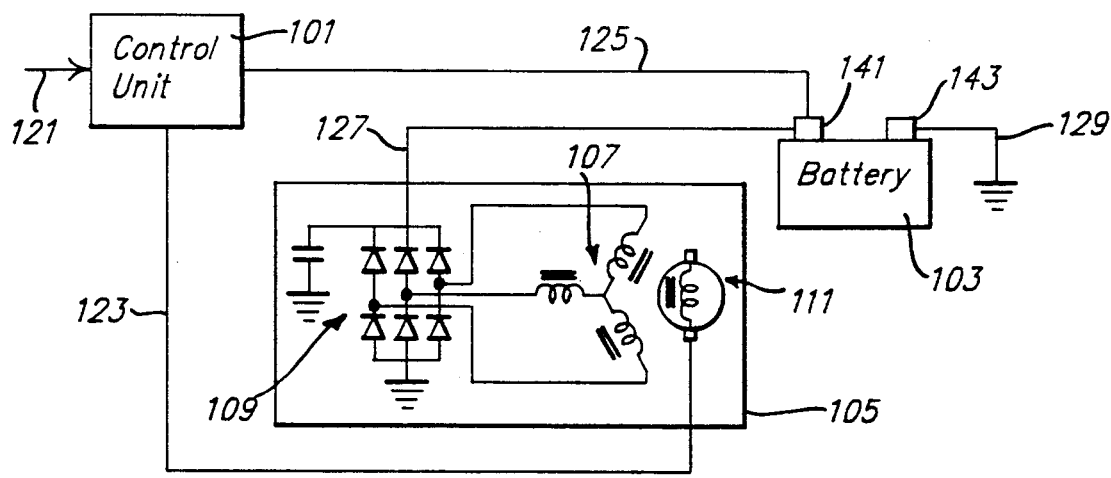
FIG. 1 is a functional block diagram of a control unit and vehicle electrical system arranged to perform the method of the invention.

FIG. 1 sets forth a functional-block diagram of the relevant elements of a vehicular electrical system to be used in conjunction with the method of the invention. The method utilizes input and output parameters already available in a vehicle utilizing an electronic engine controller having the voltage regulation function integrated therein.

With reference to FIG. 1, control unit 101, which may be a microprocessor based unit, receives engine rotational speed data (e.g. in revolutions per minute) via input lead 121. Control unit 101 additionally monitors the output voltage of the vehicle's battery 103 via battery sensing input lead 125. Lead 125 is coupled to positive terminal 141 of battery 103. Terminal 143 of battery 103 is coupled via lead 129 to ground potential.

The output current of alternator 105 is delivered to battery 103 and to the electrical load of the vehicle via alternator output 127. The alternator output current is regulated by the control unit 101 over field control lead 123 which is coupled to alternator rotor assembly 111 to control the field current therein.

Alternator stator assembly 107 shown in a conventional WYE configuration of its three phase windings is coupled to a conventional alternator output rectifier bridge 109, and the rectified output thereof is then coupled to alternator output 127.

With control unit 101 commanding the charging system through alternator 105 via field control lead 123, a target battery voltage at terminal 141 can be accurately controlled when enough alternator output current is available. Engine rotational speed in rpm determines the availability of alternator current output. When the actual battery voltage as monitored by control unit 101 is significantly lower than the target value (the amount of voltage drop below the target value is a function of rpm for example, on the order of $\frac{1}{2}$ volt or greater at higher engine rpm speeds) two situations are possible as the cause for the low voltage condition. The first possible situation is a charging system problem wherein the alternator is either fully inoperative and supplying no output charging current whatsoever to the battery or in a partial failure mode where, for example, one of the three phase windings in stator 107 has shorted out thereby rendering one phase ineffective and leading to less than optimal alternator output current levels.

The second possible situation causing the lowered battery voltage is that the output of the alternator is at a maximum level, yet still more current is required by the vehicle's load to maintain the battery level within an acceptable range of the target system voltage.

Hence the problem is to be able to distinguish between the two above situations—one a problem and one a legitimate state of the vehicle's electrical system When the method utilizes engine speed information via lead 121, even partially working charging systems can be detected. Alternator maximum current outputs are directly proportional to rotational engine speed and therefore if the output of the alternator is known, then a voltage drop at the battery when the alternator is disabled or turned off may be accurately predicted.

If there is a full or partial charging system problem then the method of the invention utilizes the fact that when the alternator is disabled or turned off, one should see no or very small voltage changes at the battery since the alternator output current is not being furnished properly in the first place. The amount of the voltage drop indicating a non-problem is a function of the rotational engine speed. Conversely, in the second situation set forth above where the alternator is at a maximum output yet is still not supplying the needs of the system load, then alternator turn-off would lead to a significant voltage drop at the battery.

In order to best utilize the method of the invention with control unit 101 and its stored program control capabilities, two functional relationships between battery voltage and engine rotational speed must be determined and stored in control unit 101 for use during the method to be set forth and further detailed below.

First, during normal system operation, acceptable battery voltage target variations versus the rotational engine speed of the vehicle over a preselected range of rotational speeds are determined. The results are stored in control unit 101, for example, in the form of a look-up table used by entering the table at an address determined by the engine's rotational speed and outputting a tabular result which represents the target variation value against which he battery voltage should be monitored by control unit 101.

Secondly, expected voltage drops at the battery in a sound operating environment can be accurately estimated also as a function of engine rotational speed since the alternator output current is directly proportional thereto. Acceptable battery voltage drops in the absence of alternator operation over a preselected range of engine rotational speeds may likewise be stored in control unit 101 as another look-up table, which is accessed in accordance with the engine speed and which provides an output giving the minimum acceptable voltage drop which will indicate charging system operability.

In other words, by looking at the engine rpm's, one can intelligently estimate the maximum output current available from the alternator and therefore can, in turn, infer what voltage drop should be expected at the battery at a typical vehicular electrical load when the alternator is switched off or disabled.

Figure 2:
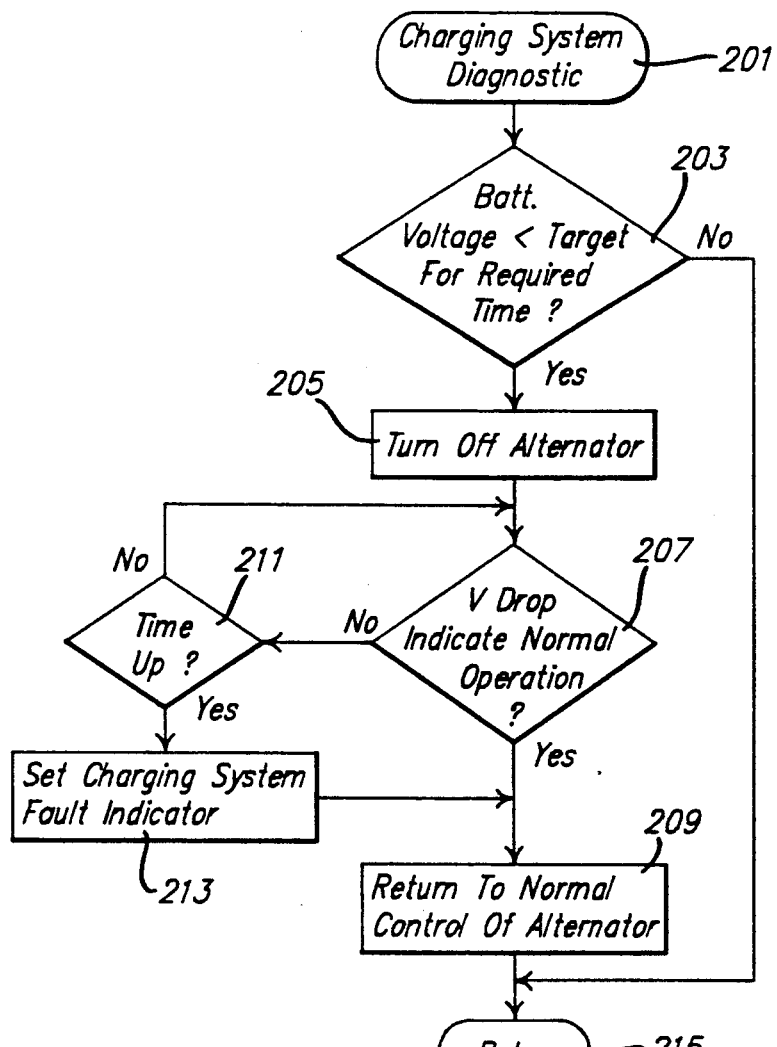
FIG. 2 is a flow chart setting forth an embodiment of the method of the invention.

An embodiment of the method is more fully described in the flow chart of FIG. 2. This routine could, for example, comprise a stored program routine utilized by control unit 101. Alternatively, the routine could be hard wired in an electrical control unit 101 utilizing hardware logic apparatus.

With reference to FIG. 2, the charging system diagnostic routine would be periodically entered at step 201 whereupon at step 203 control unit 101 would test the battery voltage at terminal 141 in comparison to a target value. If, at step 203, the battery voltage is less than the corresponding target value (by an amount which is a function of engine rpm) for a minimum time period, then the alternator is turned off at step 205. If the battery voltage is within the target level then the routine is exited and no further testing is performed.

If the alternator is turned off at step 205, control unit 101 then monitors the battery voltage at terminal 141 and tests for whether the voltage drop at the battery in the absence of alternator charging current indicates normal operation. If the voltage drop is less than a value deemed acceptable at the engine speed of interest, then control unit 101 at step 211 will determine whether the abnormal voltage drop indication has been present for a predetermined minimum time interval. If the condition has been present for the minimum time interval, then at step 213, control unit 101 will set a charging system fault indication and then return the alternator to normal operation via field control lead 123 at step 209. If the voltage drop at test 207 indicates normal operation, the alternator is immediately returned to normal operation with no further testing and the routine is exited at step 215. The minimum time periods of steps 203 and 211 are chosen to filter out transient abnormal indications in the electrical charging system. Additionally, the testing done while the alternator 105 of FIG. 1 is disabled or turned off must be performed very quickly in order for the vehicle operator not to notice an unwanted change in engine rpm.

The invention has been described with reference to the details of a preferred embodiment for the sake of example only. The scope and spirit of the invention are set forth in the appended claims.

I claim:

1. In a charging system for a vehicle having a battery and an alternator for charging the battery, a method for detecting full and partial alternator charging output failure comprising the steps of:
   (a) monitoring output voltage of the battery;
   (b) monitoring vehicular engine rotational speed;
   (c) determining a desired minimum difference between the monitored battery output voltage and a target battery voltage level, the difference being a function of the vehicular engine rotational speed;
   (d) turning off the alternator whenever the monitored battery voltage differs from the target voltage by an amount greater than the desired minimum difference;
   (e) determining a minimum acceptable battery voltage drop in the absence of alternator charging current, the minimum acceptable battery voltage drop being a function of the vehicular engine rotational speed; and
   (f) indicating a charging system fault whenever th minimum acceptable battery voltage drop is not present in the absence of alternator charging current.

2. The method of claim 1, wherein the step of turning off the alternator is performed whenever the monitored battery voltage is less than the desired target for a first preselected time period.

3. The method of claim 1, wherein the step of indicating a charging system fault is performed whenever minimum acceptable battery voltage drop is not present in the absence of alternator charging current for a second preselected time period.

4. The method of claim 2, wherein the step of indicating a charging system fault is performed whenever the minimum acceptable battery voltage drop is not present in th absence of alternator charging current for a second preselected time period.

5. The method of claim 1 comprising the additional step of turning the alternator back on after indicating a charging system fault.

6. The method of claim 2 comprising the additional step of turning the alternator back on after indicating a charging system fault.

7. The method of claim 3 comprising the additional step of turning the alternator back on after indicating a charging system fault.

8. The method of claim 4 comprising the additional step of turning the alternator back on after indicating a charging system fault.

9. In a charging system for a vehicle having a battery, an alternator for charging the battery and a stored program electronic control unit for controlling alternator output current, a method for detecting full and partial alternator charging output failure without use of an alternator current sensing device, the method comprising the steps of:
   (a) determining, with the alternator fully operational, acceptable battery voltage differences from a target voltage versus rotational engine speed of the vehicle over a preselected range of rotational speeds and saving the results in the control unit;
   (b) determining, with the alternator disabled, an acceptable voltage drop at the battery versus the rotational speed over the preselected range of rotational speeds and saving the results in the control unit;
   (c) monitoring output voltage of the battery via the control unit;
   (d) monitoring the rotational engine speed via the control unit;

(e) momentarily disabling the alternator via the control unit whenever the control unit determine that monitored battery output voltage differs from the acceptable target by more than the acceptable difference for a given rotational engine speed; and
(f) indicating a charging system fault via the control unit whenever the control unit determines that monitored battery output voltage, in the absence of alternator charging current, drops less than an acceptable voltage drop for a given rotational engine speed.

10. The method of claim 9, wherein the step of momentarily disabling the alternator is performed whenever the monitored battery output voltage is less than the acceptable target for a given rotational engine speed for a first preselected time period.

11. The method of claim 9, wherein the step of indicating a charging system fault is performed whenever the monitored battery output voltage in the absence of alternator charging current, drops less than the acceptable voltage drop for a given rotational engine speed for a second preselected time period.

12. The method of claim 10, wherein the step of indicating a charging system fault is performed whenever the monitored battery output voltage, in the absence of alternator charging current, drops less than the acceptable voltage drop for a given rotational engine speed for a second preselected time period.

13. The method of claim 9 comprising the additional step of re-enabling the alternator after step (f).

14. The method of claim 10 comprising the additional step of re-enabling the alternator after step (f).

15. The method of claim 11 comprising the additional step of re-enabling the alternator after step (f).

16. The method of claim 12 comprising the additional step of re-enabling the alternator after step (f).

* * * * *